United States Patent
Sun et al.

(10) Patent No.: US 9,781,847 B2
(45) Date of Patent: Oct. 3, 2017

(54) POSITIONING FRAME FOR MOUNTING A DISPLAY MODULE, DISPLAY DEVICE

(71) Applicants: BOE TECHNOLOGY GROUP CO., LTD., Beijing (CN); HEFEI BOE DISPLAY LIGHT CO., LTD., Hefei, Anhui (CN)

(72) Inventors: Wenbo Sun, Beijing (CN); Qiping Zhang, Beijing (CN)

(73) Assignees: BOE TECHNOLOGY GROUP CO., LTD., Beijing (CN); HEFEI BOE DISPLAY LIGHT CO., LTD., Hefei, Anhui (CN)

( * ) Notice: Subject to any disclaimer, the term of this patent is extended or adjusted under 35 U.S.C. 154(b) by 12 days.

(21) Appl. No.: 14/429,822

(22) PCT Filed: Jun. 20, 2014

(86) PCT No.: PCT/CN2014/080448
§ 371 (c)(1),
(2) Date: Mar. 20, 2015

(87) PCT Pub. No.: WO2015/106537
PCT Pub. Date: Jul. 23, 2015

(65) Prior Publication Data
US 2016/0029495 A1    Jan. 28, 2016

(30) Foreign Application Priority Data
Jan. 17, 2014 (CN) .......................... 2014 1 0023275

(51) Int. Cl.
*H05K 7/02* (2006.01)
*H05K 7/04* (2006.01)
(Continued)

(52) U.S. Cl.
CPC ......... *H05K 5/0017* (2013.01); *G02F 1/1333* (2013.01); *G06F 1/16* (2013.01);
(Continued)

(58) Field of Classification Search
CPC ....... H05K 5/0017; H05K 7/18; G02F 1/1333
(Continued)

(56) References Cited

U.S. PATENT DOCUMENTS 6,532,152 B1 * 3/2003 White ............... G02F 1/133308
312/223.1
7,927,004 B2 * 4/2011 Murakami ........ G02F 1/133608
362/633
(Continued)

FOREIGN PATENT DOCUMENTS

CN            1435713 A      8/2003
CN         101539682 A      9/2009
(Continued)

OTHER PUBLICATIONS

First Chinese Office Action Appln. No. 201410023275.7; Dated Dec. 2, 2015.
(Continued)

*Primary Examiner* — Hung S Bui
(74) *Attorney, Agent, or Firm* — Ladas & Parry LLP

(57) ABSTRACT

The present disclosure provides a positioning frame for mounting a display module and a display panel. The positioning frame includes: a plurality of side plates enclosing an accommodation zone for receiving the display module; a support bed provided on at least a pair of side plates arranged opposite to each other, and connected perpendicularly with the side plates, for supporting the display panel of the display module; baffles corresponding to the support beds one by one, the baffles are provided at the display side of the display panel, perpendicularly connected with the side
(Continued)

plate and arranged to be parallel with the support bed, for limiting the display panel in the normal direction; limiting holes provided in the baffle and support bed at least at one side; limiting element being plugged in the limiting hole for limiting the display in peripheral directions. The positioning frame enables effective assembling the display module.

14 Claims, 2 Drawing Sheets

(51) Int. Cl.
    *H05K 5/00*     (2006.01)
    *G02F 1/1333*     (2006.01)
    *H05K 7/18*     (2006.01)
    *G06F 1/16*     (2006.01)

(52) U.S. Cl.
    CPC ......... *H05K 7/18* (2013.01); *G02F 1/133308* (2013.01); *G02F 2001/133322* (2013.01); *G02F 2201/46* (2013.01)

(58) Field of Classification Search
    USPC ...................... 361/807, 809, 810, 728–730
    See application file for complete search history.

(56) References Cited

U.S. PATENT DOCUMENTS

| | | | | |
|---|---|---|---|---|
| 8,031,289 | B2* | 10/2011 | Naritomi | G02F 1/133608 349/58 |
| 8,169,566 | B2* | 5/2012 | Kim | G02F 1/133608 349/64 |
| 9,291,853 | B2* | 3/2016 | Maruno | G02F 1/133608 |
| 2005/0151894 | A1* | 7/2005 | Katsuda | G02F 1/133308 349/58 |
| 2005/0212991 | A1* | 9/2005 | Sugawara | G02F 1/133308 349/58 |
| 2006/0055839 | A1* | 3/2006 | Hirao | G02F 1/133308 349/58 |
| 2007/0229726 | A1* | 10/2007 | Azuma | G02F 1/133308 349/58 |

FOREIGN PATENT DOCUMENTS

| | | |
|---|---|---|
| CN | 201535651 U | 7/2010 |
| CN | 101813848 A | 8/2010 |
| CN | 203338336 U | 12/2013 |
| CN | 103781314 A | 5/2014 |
| JP | 2007-114590 A | 5/2007 |
| JP | 2007-279193 A | 10/2007 |

OTHER PUBLICATIONS

International Search Report Appln. No. PCT/CN2014/080448; Dated Oct. 9, 2014.
Written Opinion of the International Searching Authority Appln. No. PCT/CN2014/080448; Dated Oct. 9, 2014.
Second Chinese Office Action dated May 13, 2016; Appln. No. 201410023275.7.
Third Chinese Office Action dated Oct. 20, 2016, Appln. No. 201410023275.7.

* cited by examiner

POSITIONING FRAME FOR MOUNTING A DISPLAY MODULE, DISPLAY DEVICE

TECHNICAL FIELD

Embodiments of the present invention relates to a position frame for mounting a display module and to a display device.

BACKGROUND

With the continuous improvement of people's living standard, flat panel display devices that people intend to purchase are getting bigger and bigger, and the same time, the display devices would occupy more space in house.

As illustrated in FIG. 1, which is a schematic structural view of a display device, this display device mainly comprises: a display module (a display panel 01, an optical film 02 and a light guide plate 03), a positioning frame 04 as well as a front frame 05 and a backplate 06. When assembling such a display device, the optical film 02 and the light guide plate 03 are mounted within a groove enclosed by the positioning frame 04 and the backplate 06, and the display panel 01 is arranged on the optical film 02.

As illustrated in FIG. 1, a method for mounting the display panel 01 known to the inventor of the present invention is: attaching a front frame 05 to the front of the display panel 01, and fastening the front frame 05 and the backplate 06 by means of a screw or a clamp, thereby achieving the secure of the display panel 01. The advantages of such a mounting manner is the structure stabilization, and less mutual interference among the parts. Nonetheless, the drawback for this mounting method is that the process of securing using the clamp or screw is time-taking, assembly efficiency is low. And moreover, during repairing imperfect display devices, disassembly thereof would be very inconvenient and damage to the display device is severe.

SUMMARY

To achieve purpose mentioned above, at least one embodiment of the present disclosure provides a technical solution as follows.

A positioning frame for mounting a display module comprises:

a plurality of side plates enclosing an accommodation zone for receiving the display module;

support beds provided on at least a pair of side plates arranged opposite to each other, and connected perpendicularly with the side plates, for supporting the display panel of the display module;

baffles corresponding to the support beds one by one, the baffles are provided at the display side of the display panel, perpendicularly connected with the side plate and arranged to be parallel with the support bed, for limiting the display panel in a direction perpendicular to the display side of the display panel;

limiting holes provided in the baffles and support bed at least at one side; and a limiting element being inserting-fitted with the limiting hole for limiting the display in the peripheral direction.

With the positioning frame for mounting a display module according to the embodiment of the present disclosure, during assembling, the light guide plate, the optical film and the display panel etc. are put in sequence into the accommodation zone enclosed by a plurality of side plates, the display panel is confined between the support bed and the baffle, the limiting element is inserted into the limiting hole, the limiting element and the limiting holes cooperate to positioning the display panel in peripheral directions, and at this time mounting of the display module is done, it is thus evident that the positioning frame for mounting a display module according to embodiments of the present disclosure does not requiring installing a front frame to achieve the mounting of the display panel, thus processes of installing the front frame known to the inventor could be saved, and the assembling efficiency is improved.

Therefore, the positioning frame for mounting a display module according to at least one embodiment of the present disclosure has a simple structure, facilitates the assembling and disassembling, having a good production yield.

In an embodiment according to the present disclosure, at least at one side where no limiting hole is provided, a width of the baffle is less than a width of the support bed. Such a configuration facilitates placing the display panel between the support bed and the baffle.

In an embodiment according to the present disclosure, the limiting hole provided in the baffle and the limiting hole provided in the support bed are coaxial circular holes.

In an embodiment according to the present disclosure, the limiting element has a truncated cone configuration, and the diameter of the limiting hole provided in the support bed is less than that of the limiting hole provided in the baffle. The limiting element of such a configuration could offer better mounting stability.

In an embodiment according to the present disclosure, one end of the limiting element comprises a draw bar. The provision of the draw bar facilitates the disassembling and mounting of the limiting element by the operator.

In an embodiment according to the present disclosure, there are four side plates, wherein a pair of the side plates arranged opposite to each other are provided with the support bed, and the baffle and the support bed at one side are provided with the limiting holes. Current display panels are generally a rectangular parallelepiped, and to prevent the mounting of the display panel from being unstable, reduce the assembling processes for the operator and simplify the manufacturing processes for the positioning frame, a pair of side plates thereof arranged opposite to each other are provided with support beds, and the baffle and the support bed at a side of this pair of side plates arranged oppositely are provided with limiting holes, and the other two side plates are also provided with barricades and stoppers (the configuration in prior art), so that six sides of the display panel can be secured so as to prevent the display panel from hanging and swaying during the transport process of the display device.

In an embodiment according to the present disclosure, the positioning frame is a positioning frame made of plastics. The positioning frame made from the plastic material would not damage the display panel during the assembling process of the display device.

The positioning frame for mounting a display module according to the embodiment of the present disclosure has a simple structure, facilitates the assembling and disassembling, having higher production yield.

At lease one embodiment of the present disclosure further provides a display device comprising a display module, the display device further comprises the positioning frame according to any one of the above positioning frames. Due to that fact that the positioning frame for mounting a display module according to the embodiment of the present disclosure has a simple structure, facilitates the assembling and disassembling, having higher production yield, the display device according to embodiments of the present disclosure also has the advantages of a simple structure, facilitates the assembling and disassembling, having higher production yield, and etc.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Embodiment 1

Figure 1:
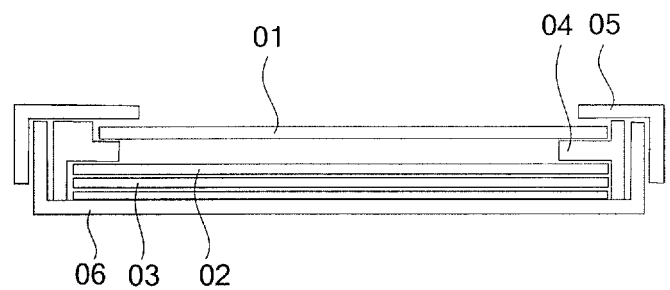
FIG. 1 is a schematic structural view of a display device.
Figure 2:
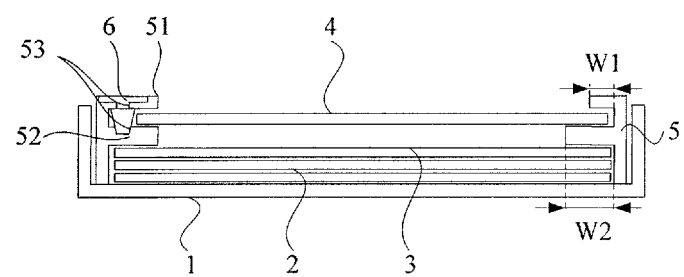
FIG. 2 is a schematic structural view of the positioning frame for mounting a display module according to an embodiment of the present disclosure assembled with a display module.

As illustrated in FIG. 2, which is a schematic structural view illustrating a positioning frame for mounting a display module according to one embodiment of the present disclosure assembled with a display module, the positioning frame comprises:

a plurality of side plates 5 enclosing an accommodation zone for receiving the display module;

a support bed 52 provided onto at least a pair of side plates 5 arranged oppositely to each other, and connected perpendicularly with the side plates 5, for supporting the display panel 4 of the display module;

baffles 51 corresponding to the support beds 52 one by one, the baffles 51 provided at the display side of the display panel 4, perpendicularly connected with the side plate 5 and arranged to be parallel with the support bed 52, for limiting the display panel in a direction perpendicular to the display side of the display panel 4;

limiting holes provided in the baffle 51 and support bed 52 at least at one side;

limiting element 6 being plugged in the limiting hole for limiting the display panel 4 in peripheral directions.

Figure 3A:
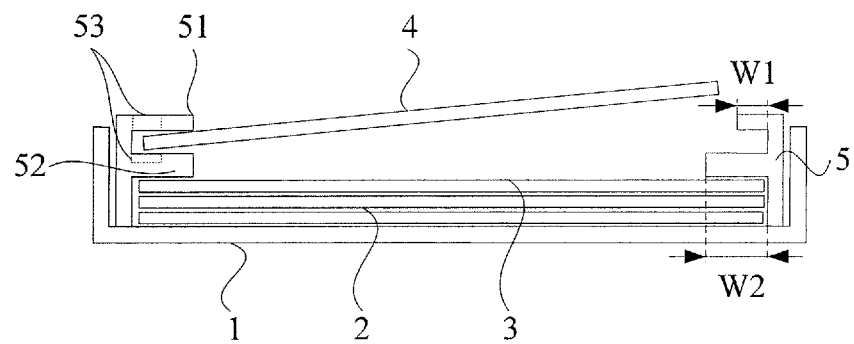
FIGS. 3a and 3b is a schematic view of states during the assembling processes of a positioning frame for mounting a display module according to an embodiment of the present disclosure with a display module.
Figure 3B:
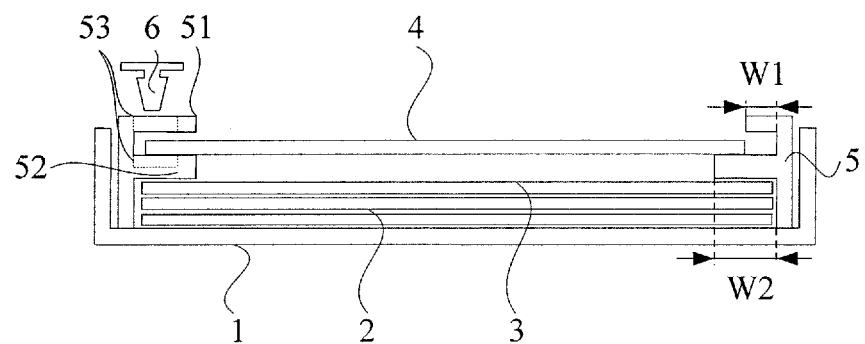

For example, taking a side-type backlight source as an example, a display module generally comprises: a light guide plate 2, optical films 3 covering the light guide plate 2, a display panel 4 disposed on the optical film 3 and etc. FIGS. 3a and 3b illustrates corresponding states during the assembling process of the positioning frame for mounting a display module according to one embodiment of the present disclosure with a display module. As illustrated in FIGS. 3a and 3b, the positioning frame for mounting a display module according to one embodiment of the present disclosure cooperates with the backplate 1 to confine the display module when in use. The assembling process is as follows: placing the positioning frame into the backplate 1, and arranging the light guide plate 2, the optical films 3 and the display panel 4 etc. in sequence into an accommodation zone enclosed by a plurality of side plates 5 (as illustrated in FIG. 3a), limiting the display panel 4 between the support bed 52 and the baffle 51 (as illustrated in FIG. 3b), plugging the limiting element 6 into the limiting holes 53, the limiting element 6 cooperating with the limiting holes 53 so as to positioning the display panel 4 in peripheral directions, thus mounting of the display module (as illustrated in FIG. 2). Thus, it is evident that the positioning frame for mounting a display module according to the embodiment of the present disclosure could achieve the secure of the display panel 4 without requiring installing a front frame, thus process of installing the front frame known to the inventor is saved and thereby assembling efficiency is improved.

Therefore, the positioning frame for mounting a display module according to the embodiment of the present disclosure has a simple structure, facilitates assembling and disassembling, having a higher production yield.

For conveniently placing the display panel 4 between the support bed 52 and the baffle 51, for example, at least at one side without a limiting hole 53, the width of the baffle 51 should be less than that of the supporting table 52. That is to say, as illustrated in FIG. 3a, at the side of the side plate without the limiting hole (i.e., at the right side in the figure), a width W1 of the baffle 51 is less than a width W2 of the support bed 52, when mounting the display panel 4, it only need to tilt the display panel 4 at a certain angle in such a way that one end of the display panel 4 is firstly inserted between the baffle 51 and the support bed 52 provided with the limiting holes, and then the other end thereof can be placed on the support bed 52 of the other side plate 5, and before plugging the limiting element 6 into the spacing hole, the display panel 4 can be translated toward the other side plate 5 so that the limiting element 6 can be plugged into the limiting hole 53.

In one embodiment, the spacing holes provided in the baffle 51 and the support bed 52 are coaxial circular holes.

The aforesaid limiting elements 6 and limiting holes 53 can take various specific shapes, for example, rectangular parallelepipeds or cylinder, for purpose of improving the mounting stability of the limiting element 6. In one embodiment of the present disclosure, the limiting element 6 has a truncated cone configuration, and the diameter of the limiting hole 53 provided in the support bed 52 is less than that of the limiting hole 53 provided in the baffle 51. The limiting element of such a configuration can offer a better secure stability.

In one embodiment, one end of the limiting element 6 has a draw bar. Provision of the draw bar facilitates the operator to disassemble or assemble the limiting element.

The display panel is generally a rectangular parallelepiped, accordingly, in one embodiment of the present disclosure, there are four side plates 5, wherein a pair of side plates 5 arranged opposite to each other are provided with support beds 52, and the baffle 51 and the support bed 52 at one side are provided with limiting holes 53 (that is, a pair of side plates arranged opposite to each other are provided with a support bed, while the baffle and support bed arranged at a side of this pair of side plates arranged opposite to each other are provided with limiting holes), and the other two side plates are also provided with barricades and stoppers (which is identical to the structure of the positioning frame known to the inventor), in this way, the positioning frame of such a configuration is simpler to be manufactured, and it's also convenient for the operator to operate, six sides of the display panel can be secured so as to prevent the display panel from hanging and swaying during the transport process of the display device.

Undoubtedly, the four side plates 5 each can also be provided with a support bed 52 and a baffle 51, wherein any pair of the side plates arranged opposite to each other are each provided with a support bed 52, and the baffle 51 and support bed 52 at one side can be provided with limiting holes 53, it is a little complex to manufacture or to assemble the positioning frame of such a configuration, however, the display module can be positioned more steadily.

When installing the display panel by operators, it's unavoidable for the display panel to be hit the positioning frame, thus for purpose of reducing damage to the display module during assembling, the positioning frame is made of plastics. Of course, the positioning frame can also be made from other elastic materials.

Embodiment 2

Based on the advantages of the positioning frame for mounting a display module provided by the above embodiment 1, the embodiment of present invention further provides a display device comprising a display module and further comprising any one of the positioning frame mentioned in above embodiments. The positioning frame for securing a display module according to the embodiment of present invention has a simpler structure and facilitates assembling and disassembling, thus enabling a higher production yield. Accordingly, the display device according to embodiments of present invention also has a simpler structure and facilitates assembling and disassembling, and thus enabling a higher production yield.

The foregoing are merely exemplary embodiments of the invention, but are not used to limit the protection scope of the invention. The protection scope of the invention shall be defined by the attached claims.

The present application claims the priority of the Chinese patent application No. 201410023275.7 filed on Jan. 17, 2014, the disclosure of which is hereby entirely by reference.

The invention claimed is:

1. A positioning frame for mounting a display module, comprising:
   a plurality of side plates enclosing an accommodation zone for receiving the display module;
   a support bed provided on at least a pair of side plates arranged opposite to each other, and connected perpendicularly with the side plate, for supporting a display panel of the display module;
   baffles corresponding to the support beds one by one, the baffles provided at a display side of the display panel, perpendicularly connected with the side plate and arranged to be parallel with the support bed, for limiting in the normal direction of the display panel;
   limiting holes provided in the baffle and the support bed at least at one side; and
   a limiting element being plugged in the limiting holes for limiting the display panel in the peripheral directions;
   wherein at least at one side on which no limiting hole is provided, a width of the baffle is less than a width of the support bed.

2. The positioning frame according to claim 1, wherein the limiting holes provided in the baffle and the support bed are coaxial circular holes.

3. The positioning frame according to claim 2, wherein the limiting element has a truncated cone configuration, and the diameter of the limiting hole provided in the support bed is less than that of the limiting hole provided in the baffle.

4. The positioning frame according to claim 2, wherein one end of the limiting element is provided with a draw bar.

5. The positioning frame according to claim 2, wherein the number of the plurality of side plates is four, wherein a pair of the side plates arranged opposite to each other are provided with the support bed, and the baffle and the support bed at one side are provided with the limiting holes.

6. The positioning frame according to claim 2, wherein the positioning frame is made of plastics.

7. The positioning frame according to claim 1, wherein the limiting element has a truncated cone configuration, and the diameter of the limiting hole provided in the support bed is less than that of the limiting hole provided in the baffle.

8. The positioning frame according to claim 7, wherein one end of the limiting element is provided with a draw bar.

9. The positioning frame according to claim 7, wherein the number of the plurality of side plates is four, wherein a pair of the side plates arranged opposite to each other are provided with the support bed, and the baffle and the support bed at one side are provided with the limiting holes.

10. The positioning frame according to claim 1, wherein one end of the limiting element is provided with a draw bar.

11. The positioning frame according to claim 10, wherein the number of the plurality of side plates is four, wherein a pair of the side plates arranged opposite to each other are provided with the support bed, and the baffle and the support bed at one side are provided with the limiting holes.

12. The positioning frame according to claim 1, wherein the number of the plurality of side plates is four, wherein a pair of the side plates arranged opposite to each other are provided with the support bed, and the baffle and the support bed at one side are provided with the limiting holes.

13. The positioning frame according to claim herein the positioning frame is made of plastics.

14. A display device comprising a display module, the display device further comprises the positioning frame according to claim 1.

* * * * *